United States Patent
Chiang et al.

(10) Patent No.: US 10,886,593 B2
(45) Date of Patent: Jan. 5, 2021

(54) STRUCTURE OF INTEGRATED RADIO FREQUENCY MULTI-CHIP PACKAGE AND METHOD OF FABRICATING THE SAME

(71) Applicant: INDUSTRIAL TECHNOLOGY RESEARCH INSTITUTE, Hsinchu (TW)

(72) Inventors: Ching-Wen Chiang, Chiayi (TW); Yen-Cheng Kuan, Kaohsiung (TW); Chia-Jen Liang, Kaohsiung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 77 days.

(21) Appl. No.: 16/232,651

(22) Filed: Dec. 26, 2018

(65) Prior Publication Data

US 2020/0203817 A1 Jun. 25, 2020

(30) Foreign Application Priority Data

Dec. 19, 2018 (TW) .............................. 107145860 A

(51) Int. Cl.
*H01Q 1/22* (2006.01)
*H03H 7/38* (2006.01)
*H01L 23/66* (2006.01)

(52) U.S. Cl.
CPC ............ *H01Q 1/2283* (2013.01); *H01L 23/66* (2013.01); *H03H 7/38* (2013.01); *H01L 2223/6677* (2013.01)

(58) Field of Classification Search
CPC ........ H01Q 1/38; H01Q 1/2283; H01L 23/66; H01L 2223/6677; H03H 7/38
See application file for complete search history.

(56) References Cited

U.S. PATENT DOCUMENTS

| 7,675,465 | B2 | 3/2010 | Doan et al. |
| 7,768,457 | B2 | 8/2010 | Pettus et al. |
| 8,264,300 | B2 | 9/2012 | Cisco |

(Continued)

FOREIGN PATENT DOCUMENTS

| CN | 108461458 | A | 8/2018 |
| TW | 201721978 | A | 6/2017 |

(Continued)

OTHER PUBLICATIONS

Taiwanese Office Action issued in corresponding application No. 107145860, dated Jul. 2, 2019.

(Continued)

*Primary Examiner* — Robert Karacsony
(74) *Attorney, Agent, or Firm* — Maschoff Brennan

(57) ABSTRACT

An antenna package structure comprises a substrate with a first surface and a second surface; a dielectric layer, disposed on the first surface of the substrate comprises at least a impedance matching structure and an interconnection structure; a molding layer, disposed on the dielectric layer comprises a plurality of chips wherein a control chip electrically connects to the impedance matching structure and a plurality of conducting structures; an antenna layer, disposed on the second surface of the substrate comprising at least an antenna electrically connects to the substrate; and a protection layer covers the antenna layer.

20 Claims, 7 Drawing Sheets

(56) References Cited

U.S. PATENT DOCUMENTS

| | | | |
|---|---|---|---|
| 9,252,491 | B2 | 2/2016 | Liu et al. |
| 9,484,226 | B2 | 11/2016 | Hwang et al. |
| 9,613,931 | B2 | 4/2017 | Lin et al. |
| 9,922,964 | B1 | 3/2018 | Chen et al. |
| 2013/0215569 | A1 | 8/2013 | Oh |
| 2015/0061091 | A1* | 3/2015 | Seler ............... H01L 24/19 257/664 |
| 2015/0084194 | A1* | 3/2015 | Molzer ............ H01L 23/481 257/741 |
| 2015/0084208 | A1 | 3/2015 | Iida et al. |
| 2018/0174865 | A1 | 6/2018 | Yu et al. |
| 2020/0185299 | A1* | 6/2020 | Chang ............... H01L 24/19 |

FOREIGN PATENT DOCUMENTS

| | | |
|---|---|---|
| TW | I618175 A | 11/2017 |
| TW | I620300 B | 4/2018 |

OTHER PUBLICATIONS

Brian Curran, et al., "Development and Validation of a Chip Integration Concept for Multi-Die GaAs Front Ends for Phased Arrays up to 60 GHz", IEEE E Transactions on Components, Packaging and Manufacturing Technology, vol. 8, No. 7, Jul. 2018.

Choi, P., et al. (Aug. 11, 2014). "A case for leveraging 802.11p for direct phone-to-phone communications." 2014 IEEE/ACM International Symposium on Low Power Electronics and Design (ISLPED).

Chung-Hao Tsai, Jeng-Shien Hseih, Monsen Liu, En-Hsiang Yeh, Hsu-Hsein Chen, Ching-Wen Hsiao, Chen-Shien Chen, Chung-Shi Liu, Mirng-Ji Lii, Chuei-Tang Wang, and Doug Yu, "Array Antenna Integrated Fan-Out Wafer Level Packaging (InFO-WLP) for Millimeter Wave System Applications", IEEE International Electron Devices Meeting, pp. 25.1.1-25.1-4, Dec. 2013.

Cheng-Ta Ko, et al. "Chip-First Fan-Out Panel-Level Packaging for Heterogeneous Integration" IEEE 68th Electronic Components and Technology Conference, May 2018.

Daijiro Ishibashi, Shinya Sasaki, Yoshikatsu Ishizuki, Shinya Iijima, Yoshihiro Nakata, Yoichi Kawano, Toshihide Suzuki, and Motoaki Tani, "Integrated Module Structure of Fan-out Wafer Level Package for Terahertz Antenna", IEEE 65th Electronic Components and Technology Conference (ECTC), May 2015.

Heijden, M. P. v. d., et al. (Jun. 2, 2013). "A package-integrated 50W high-efficiency RF CMOS-GaN class-E power amplifier." 2013 IEEE MTT-S International Microwave Symposium Digest (MTT).

Peng, P. J., et al. (Jan. 28, 2015). "A 94 GHz 3D Image Radar Engine With 4TX/4RX Beamforming Scan Technique in 65 nm CMOS Technology." Ieee Journal of Solid-State Circuits 50(3): 656-668.

Zhang et al., "Stress Analysis of Spacer Paste Replacing Dummy Die in a Stacked CSP Package", IEEE Oct. 28, 2003, Fifth International Conference onElectronic Packaging Technology Proceedings.

T. Braun, S. Raatz, S. Voges, R. Kahle, V. Bader, J. Bauer, K-F. Becke, and T. Thomas, "Large Area Compression Molding for Fan-out Panel Level Packing", IEEE 65th Electronic Components and Technology Conference (ECTC), May 2015.

* cited by examiner

STRUCTURE OF INTEGRATED RADIO FREQUENCY MULTI-CHIP PACKAGE AND METHOD OF FABRICATING THE SAME

TECHNICAL FIELD

The technical field relates to package of integrated multi-chip. In another aspect, the invention relates to package of integrated multi-chip including radio frequency devices.

BACKGROUND

Recently, as the booming development of AI technology, vehicle electronics, internet of things, 5G communication, industrial applications, cloud computing, and augmented/virtual reality, the demands of chips with higher performance are also multiplied. However, chips with higher performance also come with higher complexity system. As a result, it becomes an extremely challenge to manufacture the chip with high performance/complexity system at a reasonable cost while maintaining quality and reliability.

The advantages of heterogeneous integration package of semiconductor devices are minimized spaces and thickness of a package, logic circuit and memory integrated with the highest cost benefit rate, and diversified solutions with higher flexibility. However, due to the impedance mismatch of the radio frequency circuit, the signal loss is caused and the output gain is reduced. Therefore, an extra impedance match process is needed after the redistribution integration. Also, in an integrated multi-chip package, due to the difference in thermal expansion coefficient and stress mismatch between heterogeneous materials, the difficulty and cost of semiconductor heterogeneous integration are relatively increased.

SUMMARY

An integrated antenna package structure and the manufacturing method thereof are provided.

In an exemplary embodiment, an antenna package structure comprising: a substrate with a first surface and a second surface; a dielectric layer disposed on the first surface of the substrate, wherein the dielectric layer comprises at least one impedance matching structure and an interconnection structure, wherein the impedance matching structure electrically connected to the substrate by the interconnection structure; a molding layer disposed on the dielectric layer, wherein the molding layer comprises a plurality of chips and a plurality of conductor structures, the chips comprise a control chip, and each of the conductor structures penetrate through the molding layer and electrically connected to the interconnection structure of the dielectric layer, wherein the control chip is electrically connected to the impedance matching structure a control the impedance matching structure, and the control chip is disposed on a first direction of the impedance matching structure, wherein the first direction is vertical to the first surface; an antenna layer disposed on the second surface of the substrate, wherein the antenna layer comprises at least one antenna electrically connected to the substrate; and a protection layer covering the antenna layer.

In another exemplary embodiment, a manufacturing method of an antenna package structure comprises: providing a substrate, wherein the substrate having a first substrate and a second substrate; disposing a dielectric layer on the first surface of the substrate, wherein the dielectric layer comprises at least one impedance matching structure and an interconnection structure, wherein the impedance matching structure is electrically connected to the substrate through the interconnection structure; disposing a plurality of chips and a plurality of conductor structures on the dielectric layer, wherein the conductor structures are electrically connected to the interconnection structure of the dielectric layer, wherein the chips comprise a control chip; covering a molding layer on the chips, the dielectric layer, and the conductor structures, and exposing each of the conductor structures from the molding layer; rotating the substrate; disposing an antenna layer on the second surface of the substrate, wherein the antenna layer comprises at least one antenna electrically connected to the substrate; and covering a protection layer on the antenna layer; wherein the control chip is electrically connected to the impedance matching structure to control the impedance matching structure, wherein the control chip is disposed on a first direction of the impedance matching structure, wherein the first direction is vertical to the second surface.

Methods disclosed above may be practiced by the devices or systems disclosed above which are hardware or firmware capable of performing particular functions and may take the form of program code embodied in a memory and/or embodied in a computer-readable storage medium/computer program product, combined with specific hardware. When the program code is loaded into and executed by an electronic device, a controller, a computer processor or a machine, the electronic device, the processor, the computer or the machine becomes an apparatus or system for practicing the disclosed method.

BRIEF DESCRIPTION OF THE DRAWINGS

The application will become more fully understood by referring to the following detailed description with reference to the accompanying drawings, wherein.

DETAILED DESCRIPTION

Figure 1A:
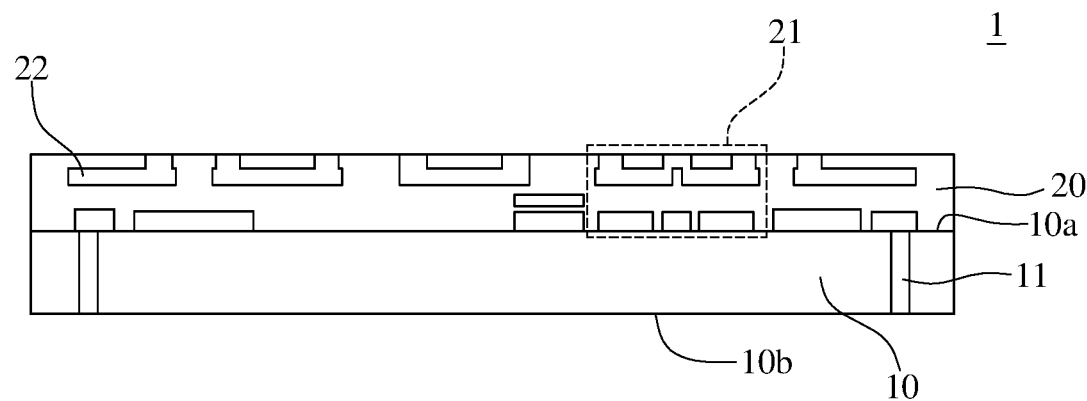
FIG. 1a to FIG. 6 illustrate a manufacturing process of an antenna package structure according to an embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that the embodiments may be realized in software, hardware, firmware, or any combination thereof.

In the following embodiments of the disclosure, an antenna package structure and method of fabricating the same is provided. In the embodiments of the disclosure, panel level package process is adopted as the manufacturing process. Comparing with wafer level package process, panel level package process can use larger substrate in the manufacturing process to increase the production rate. Also, the substrate used in panel level package process is in square shapes, not in circular shapes, thus the manufacturing area on the substrate can be used more effectively.

FIG. 1a to FIG. 6 illustrate a manufacturing process of an antenna package structure according to an embodiment of the application. As shown in FIGS. 1a and 1b, a substrate 10 is provided, the substrate 10 has a first surface 10a and a second surface 10b, and the substrate 10 comprises conductor pillars 11 penetrate from the first surface 10a to the second surface 10b. The substrate 10 comprises at least two layers, and the material of the substrate 10 comprises low temperature co-fired ceramic (LTCC), FR-4 epoxy glass fabric, RO high frequency circuit board, glass, or thermal interface materials. The thermal interface materials comprise thermal grease, thermal gel, phase change material, phase change metal alloy, and thermal gap filler. An electromagnetic shielding layer can be selectively disposed in the substrate 10, as to shield electromagnetic waves transfer from the first surface 10a of the substrate to the second surface 10b of the substrate. It should be noted that, the conductor pillars 11 for electrical connection from the first surface 10a to the second surface 10b in the embodiment can be replaced as redistribution lines or outer circuit for electrical connection in other embodiments, so it is not limited thereto.

Then, forming a dielectric layer 20 on the first surface 10a of the substrate 10. The dielectric layer 20 comprises an impedance matching structure 21 and an interconnection structure 22. The dielectric layer 20 is a multilayer structure, and each of the layer of the dielectric layer 20 can be formed by printing process or deposition process. The route of metal lines of the impedance matching structure 21 and the interconnection structure 22 can be determined by photolithography process, then the metal lines can be formed by metal deposition process or electroless plating process. After repeating the deposition process, photolithography process, and the metal deposition process, the dielectric layer 20 is formed. The material of dielectric layer 20 comprises polyimide (PI), benzocyclobutene (BCB), or any other photosensitive material. The impedance matching structure 21 is electrically connected to the substrate 10 through the interconnection structure 22. In other embodiments, a plurality of passive components can be disposed in the dielectric layer 20. The passive components are, for example, are resistors, capacitors, inductors, transformer, or passive filter, which electrically connected to the interconnection structure 22.

Figure 1B:
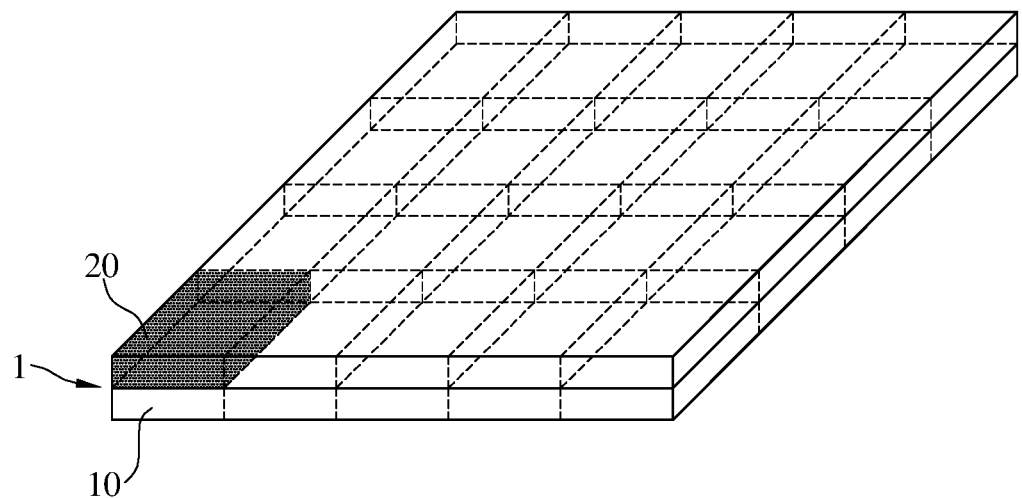

FIG. 1b illustrates the antenna package structure 1 of FIG. 1a located in a panel P. A plurality of antenna package structure 1 can be formed at a same time due to the panel level package process is adopted in the embodiment. The area of panel P is 24"×18" for example.

Figure 2A:
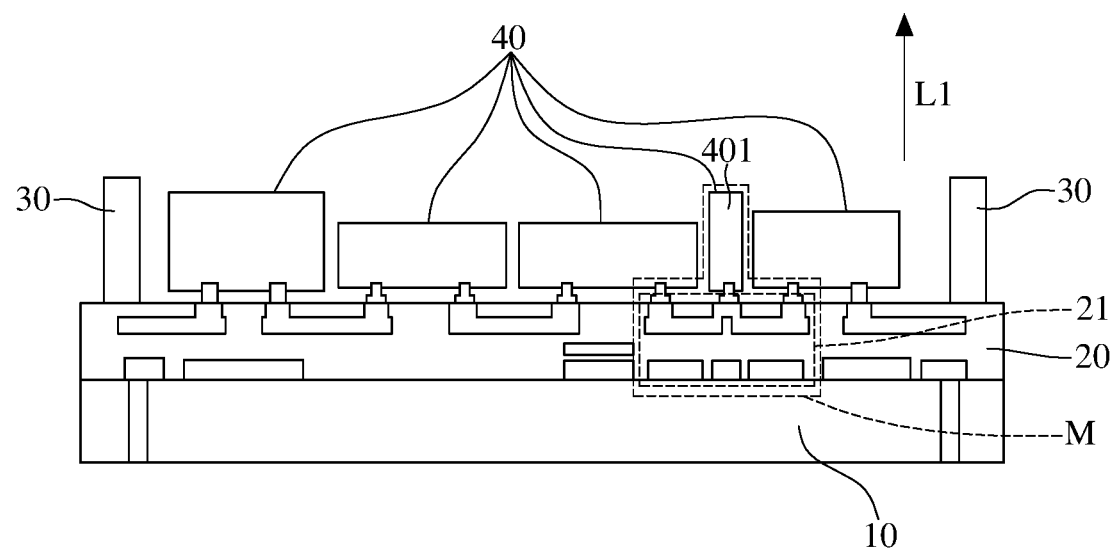

Referring to FIG. 2a, a plurality of conductor structures 30 and a plurality of chips 40 are disposed on the dielectric layer 20. The chips 40 comprise a control chip 401. The material of conductor structures 30 comprise gold, tin, silver, or copper. The conductor structures 30 can be formed by plating, electroless plating, or printing process. In the embodiment, the conductor structures 30 are formed as pillar shapes by plating process. In other embodiments, the conductor structures 30 can be formed as ball shapes or ellipsoid shapes by other manufacturing process, so it is not limited thereto.

After the conductor structures 30 are formed, the chips 40 are disposed on the dielectric layer 20. The chips 40 comprise the control chip 401 and further comprise analog to digital converters, digital to analog converters, power amplifiers, RF front-end devices, or storage devices. The control chip 401 is disposed on a first direction L1 from the impedance matching structure 21, and the first direction L1 is vertical to the first surface 10a of the substrate 10. The control chip 401 is electrically connected to the impedance matching structure 21 to control the impedance matching structure 21. The control chip 401 and the impedance matching structure 21 form a tunable matching structure M. It should be noted that, other components can be avoided setting on the first direction L1 from the impedance matching structure 21 in the dielectric layer 20, as to additionally using the control chip 401 as a dummy device to adjust the stress distribution in the antenna package structure 1.

Figure 2B:
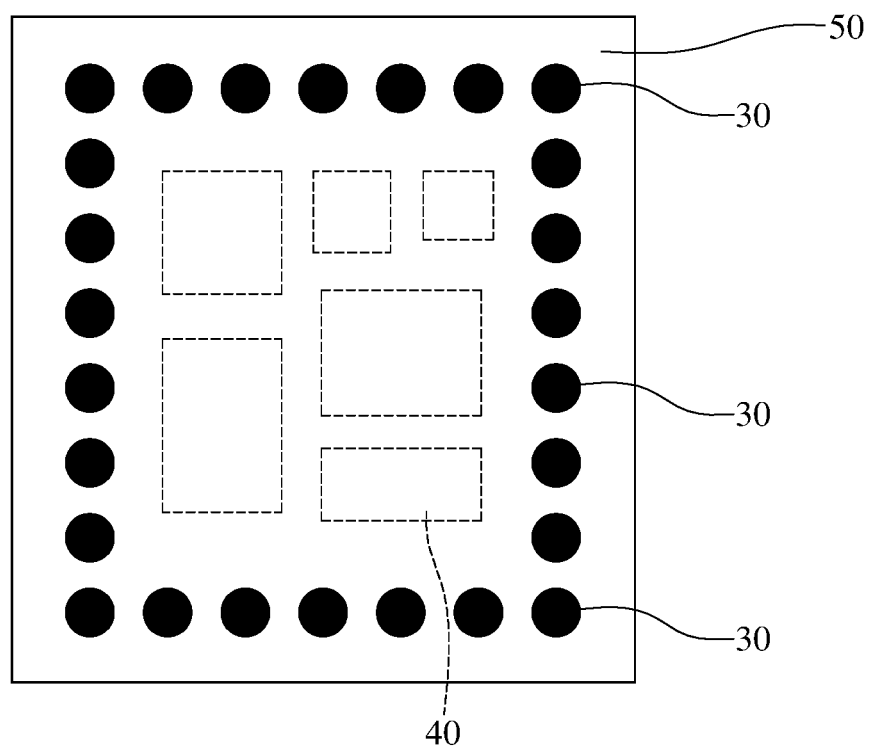

FIG. 2b is a top view of FIG. 2a. In the embodiment, the conductor structures 30 are disposed on the edge around the dielectric layer 20, and the chips 40 are disposed on the central part of the dielectric layer 20. It should be noted that the conductor structures 30 can be disposed uniformly or irregularly on the dielectric layer 20. In other embodiments, and the chips 40 can be disposed between each of the conductor structures 30, so it is not limited thereto.

Figure 3:
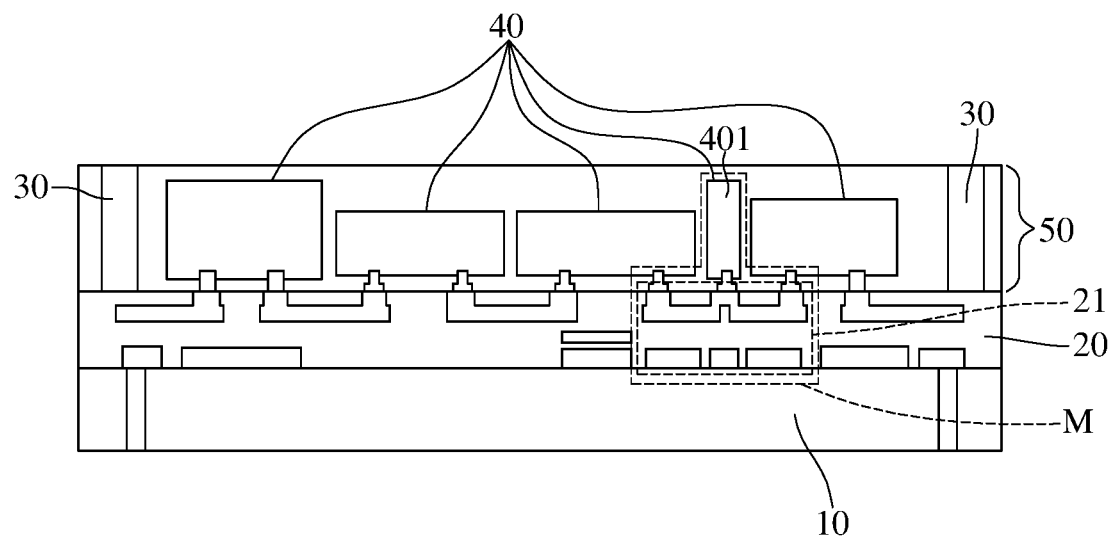

Then, referring to FIG. 3, covering a molding material on the conductor structures 30 and the chips 40 to form a molding layer 50. The material of the molding layer 50 comprises epoxy, phenolic resins, or silicon filler. The molding layer 50 can be formed to fully cover or partially cover the conductor structures 30. In the embodiment, the molding layer 50 partially covers the conductor structures 30 for electrically connecting the conductor structures 30 to external devices. In other embodiments, the molding layer 50 can fully covers the conductor structures 30, and the conductor structures 30 can be exposed from the molding layer 50 by grinding process or a chemical mechanical planarization (CMP) process.

Figure 4:
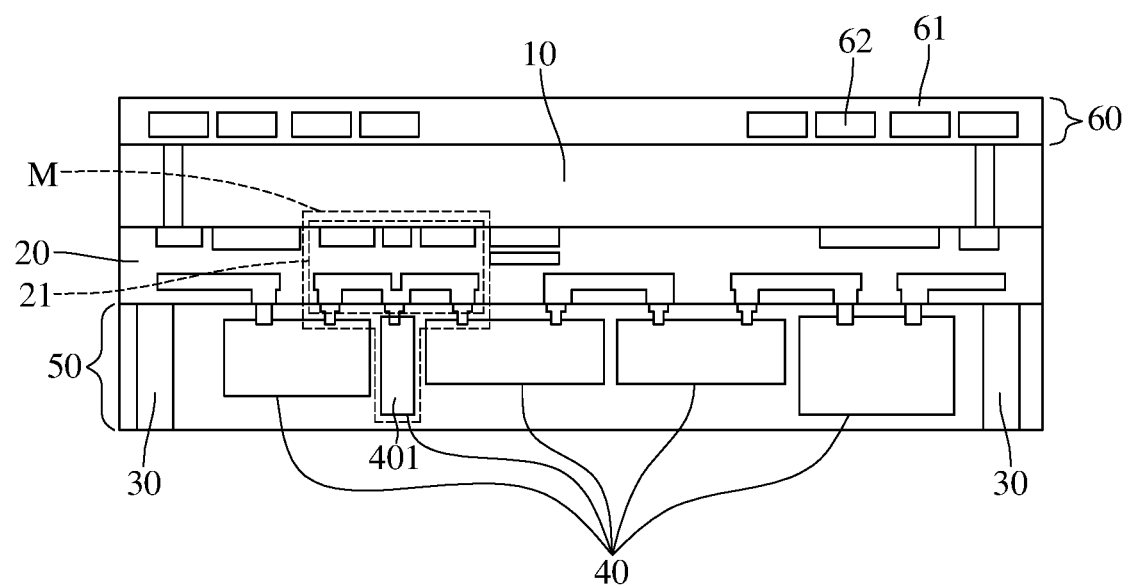

Then, rotating the substrate 10 as illustrated in FIG. 4, and disposing an antenna layer 60 on the second surface 10b of the substrate 10. The antenna layer 60 is composed of dielectric material 61 and conductor material 62, and the conductor material 62 forms antenna structures. The antenna layer 60 can be a single layer structure or a multilayer structure. The forming method of the antenna layer 60 comprises photolithography process after deposition process or printing process. In the embodiment, the antenna layer 60 comprises at least one antenna electrically connected to the substrate 10. In other embodiment, the antenna layer 60 could comprises a plurality of antenna array disposed as an end-fire array or a broadside array. The dielectric material 61 comprises nitride, silicide, polyimide (PI), or benzocyclobutene (BCB). In the embodiment, the tunable matching structure M and the antenna are both electrically connected to the substrate 10. The impedance matching of the circuit of the antenna package structure 1 can be performed through the tunable matching structure M to prevent signal loss and reduce gain.

Figure 5:
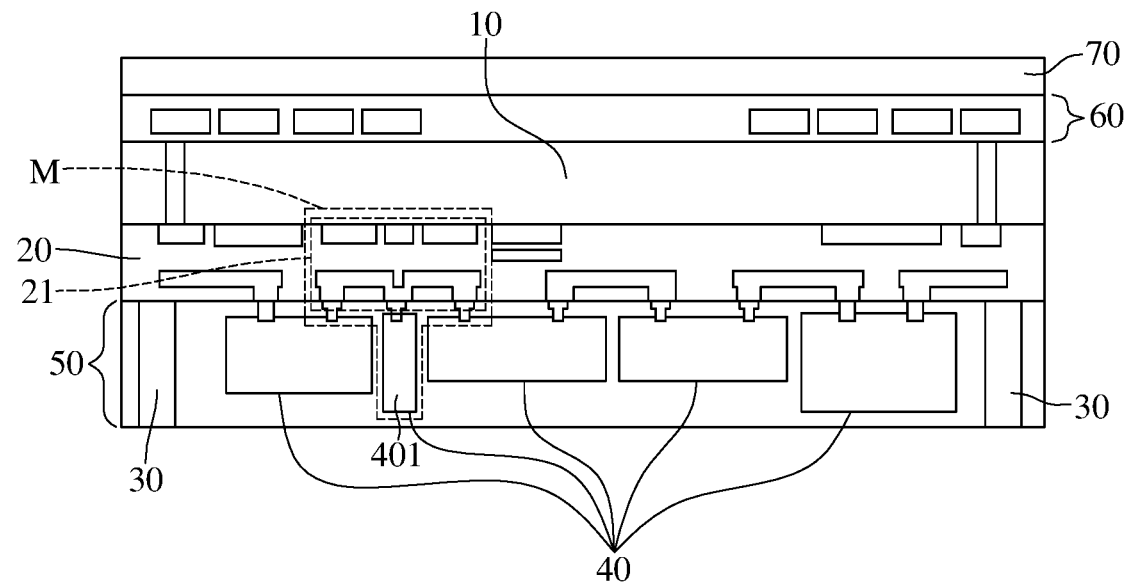

Finally, as illustrated in FIG. 5, covering a protection layer 70 on the antenna layer 60 to complete the antenna package structure 1 of the embodiment. The forming method of the protection layer 70 comprises printing process or deposition process. The material of the protection layer 70 comprises dielectric material, polycrystalline silicon, liquid crystal or glass.

As illustrated in FIG. 5, the antenna package structure 1 of the embodiment comprises a substrate 10, a dielectric layer 20, a molding layer 50, an antenna layer 60, and a protection layer 70. The substrate 10 has a first surface 10a, a second surface 10b, and conductor pillars 11 penetrate from the first surface 10a to the second surface 10b. The substrate 10 is a multilayer board comprises at least two layers. The material of the substrate 10 comprises low temperature co-fired ceramic, FR-4 epoxy glass fabric, RO high frequency circuit board, glass, or thermal interface materials. The thermal interface materials comprise thermal grease, thermal gel, phase change material, phase change metal alloy, and thermal gap filler. An electromagnetic shielding layer can be selectively disposed in the substrate 10 to shield the electromagnetic waves transferring from the side of first surface 10a to the side of the second surface 10b of the substrate 10. In other embodiments, the conductor pillars 11 can be replaced as redistribution lines or external circuit, so it is not limited thereto.

The dielectric layer 20 comprises an impedance matching structure 21 and an interconnection structure 22. The dielectric layer 20 is a multilayer structure. The material of the dielectric layer 20 comprises polyimide (PI), benzocyclobutene (BCB), or any other photosensitive material. The impedance matching structure 21 is electrically connected to the substrate 10 through the interconnection structure 22. In other embodiments, the dielectric layer 20 further comprises a plurality of passive components, such as resistors, capacitors, inductors, transformers, and passive filters, which electrically connected to the interconnection structure 22.

The molding layer 50 comprises a plurality of conductor structures 30 and a plurality of chips 40. The chips 40 comprise a control chip 401. The material of the molding layer comprises epoxy, phenolic resins, or silicon filler. In the embodiment, the conductor structures 30 are formed as pillar shapes. In other embodiments, the conductor structures 30 can be formed as ball shapes or ellipsoid shapes, so it is not limited thereto. The chips 40 comprise the control chip 401 and further comprise analog to digital converters, digital to analog converters, power amplifiers, RF front-end devices, or storage devices. The control chip 401 is disposed on a first direction L1 from the impedance matching structure 21. The first direction L1 is vertical to the first surface 10a of the substrate 10. The control chip 401 is electrically connected to the impedance matching structure 21 to control the impedance matching structure 21. It should be noted that other components can be avoided setting on the first direction L1 from the impedance matching structure 21 in the dielectric layer 20, as to additionally using the control chip 401 as a dummy device to adjust the stress distribution in the antenna package structure 1. In the embodiment, the conductor structures 30 are disposed on the edge around the dielectric layer 20, and the chips 40 are disposed on the central part of the dielectric layer 20. In other embodiments, the conductor structures 30 can be disposed uniformly or irregularly on the dielectric layer 20, and the chips 40 can be disposed between each of the conductor structures 30, so it is not limited thereto.

The antenna layer 60 is composed of dielectric material 61 and conductor material 62, and the conductor material 62 form antenna structures. The antenna layer 60 is a single layer structure or a multilayer structure. In the embodiment, the antenna layer 60 comprises at least one antenna electrically connected to the substrate 10. In other embodiments, the antenna layer 60 could comprises a plurality of antenna arrays disposed as an end-fire array or a broadside array. The material of the dielectric layer 20 comprises polyimide (PI), benzocyclobutene (BCB), or any other photosensitive material. The material of the protection layer 70 comprises dielectric materials, polycrystalline silicon, liquid crystal or glass. In the embodiment, the tunable matching structure M and the antenna are both electrically connected to the substrate 10. The impedance matching of the circuit of the antenna package structure can be performed through the tunable matching structure M to prevent signal loss and reduce gain.

Figure 6:
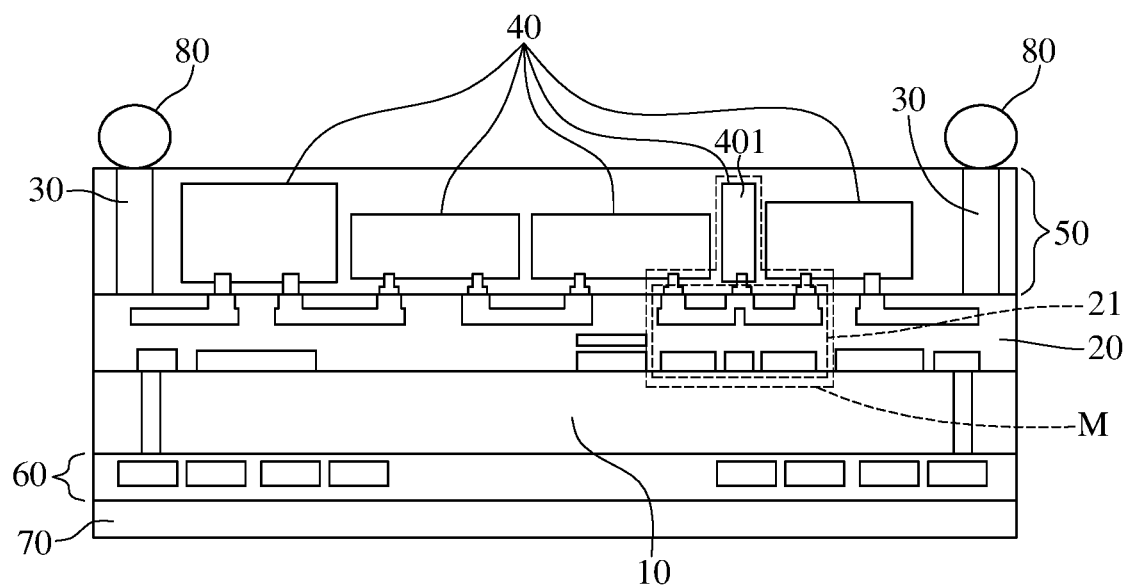

As illustrated in FIG. 6, the antenna package structure 1 of the embodiment can also selectively to form a plurality of metal balls 80 on the conductor structures 30 for the electrical connection of the antenna package structure 1 to external devices. The material of metal balls 80 comprises gold, tin, silver, or copper. The forming method of the metal balls 80 comprises thin film process, printing process, electroless plating, plating, or deposition process.

Figure 7:
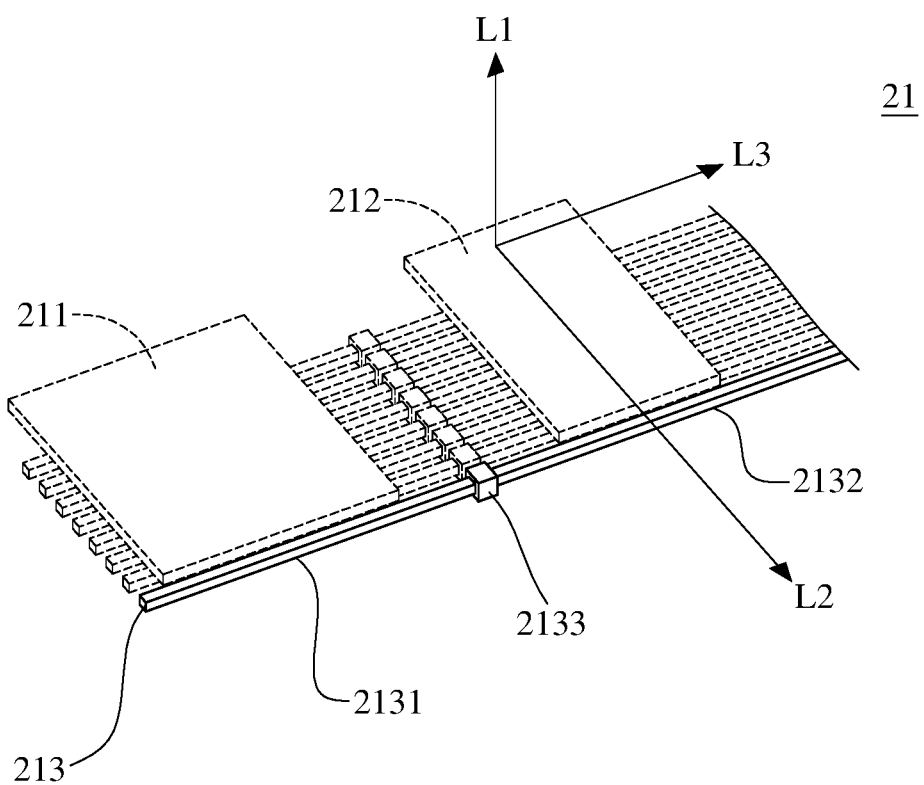
FIG. 7 is an illustration of an impedance matching structure of an antenna package structure according to an embodiment of the application.

As shown in FIG. 7, the impedance matching structure 21 of the antenna package structure 1 is illustrated. In the embodiment, the impedance matching structure 21 is a slow wave structure. The forming method of the impedance matching structure 21 comprises forming a first conductor plate 211 and a second conductor plate 212, and forming at least one floating conductor line 213 below the first conductor plate 211 and the second conductor plate 212. The first conductor plate 211 is disposed along a second direction L2, and the second conductor plate 212 is disposed along a third direction L3 from the first conductor plate 211 and neighboring to the first conductor plate 211. The floating conductor line 213 is disposed on the second direction L2 and below the first conductor plate 211 and the second conductor plate 212. The floating conductor line 213 comprises a first conductor line 2131, a second conductor line 2132, and a switch device 2133. The floating conductor line 213 is electrically connected to the control chip 401 through the interconnection structure 22. The first conductor plate 211 and the second conductor plate 212 are electrically connected to ground. The floating conductor line 213 is selectively electrically connected to the first conductor line 2131 or the second conductor line 2132 through the switch device 2133 to tune the impedance matching structure 21.

Figure 8:
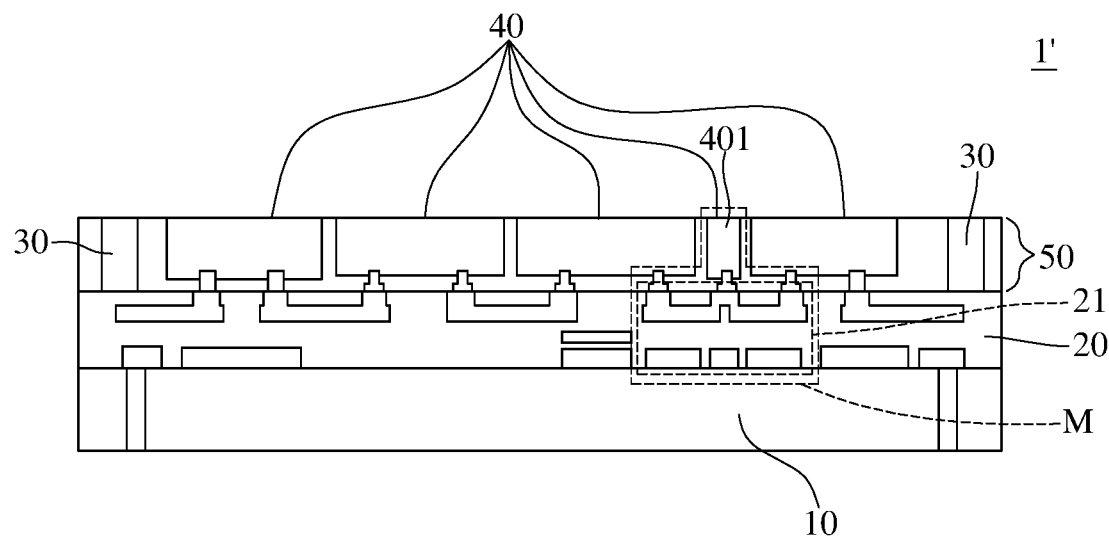
FIG. 8 to FIG. 11 illustrate a manufacturing process of an antenna package structure according to another embodiment of the application.

FIG. 8 to FIG. 11 illustrate a manufacturing process of an antenna package structure 1' of another embodiment of the disclosure. Comparing with the manufacturing process of the previous embodiment, the manufacturing process of the embodiment are the same in the steps of FIG. 1a, FIG. 2a, and FIG. 3. After the manufacturing process of FIG. 3 are finished, a thinning process is proceed to the antenna package structure 1' as illustrated in FIG. 8. The thickness of the conductor structures, the chips 40, and the molding layer 50 are reduced after the thinning process, and also the chips 40 are exposed from the molding layer 50. The forming method of the thinning process comprises grinding process and chemical mechanical planarization (CMP) process.

Figure 9:
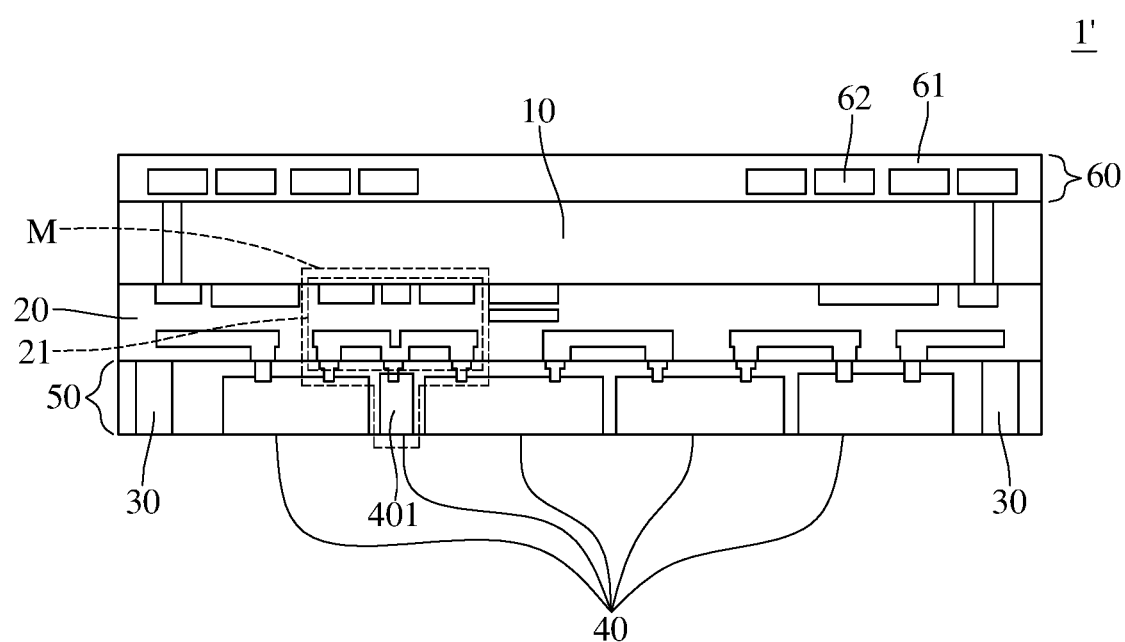

Then, rotates the substrate 10 as illustrated in FIG. 9 to form an antenna layer 60 on the second surface 10b of the substrate 10. The antenna layer 60 is composed of dielectric material 61 and conductor material 62. The conductor material 62 form antenna structures. The antenna layer 60 is a single layer structure or a multilayer structure. The forming method of the antenna layer 60 comprises photolithography process after deposition process or printing process. In the embodiment, the antenna layer 60 comprises at least one antenna electrically connected to the substrate 10. In other embodiment, the antenna layer 60 could comprises a plurality of antenna array disposed as an end-fire array or a broadside array. The dielectric material 61 comprises nitride, silicide, polyimide (PI), or benzocyclobutene (BCB).

Figure 10:
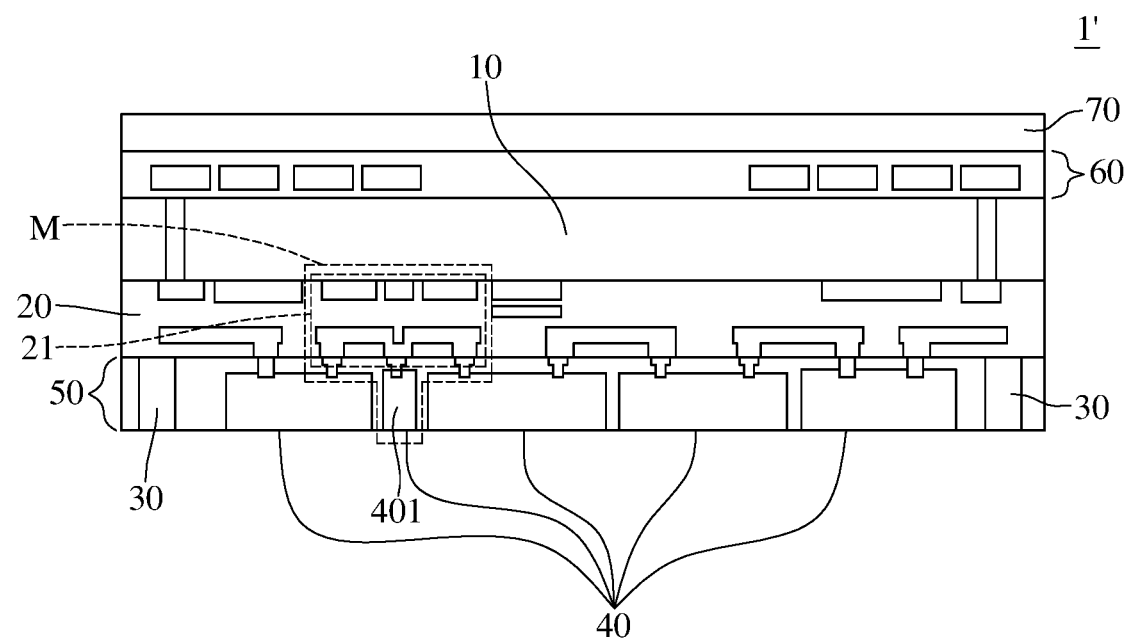

Finally, as illustrated in FIG. 10, a protection layer 70 is formed on the antenna layer 60 to complete the antenna package structure 1' of the embodiment. The forming method of the protection layer 70 comprises printing process of deposition process. The material of the protection layer 70 comprises dielectric materials, polycrystalline silicon, liquid crystal, or glass.

As shown in FIG. 10, the antenna package structure 1' comprises a substrate 10, a dielectric layer 20, a molding layer 50, an antenna layer 60, and a protection layer 70. The substrate 10 has a first surface 10a, a second surface 10b, and conductor pillars 11 penetrate from the first surface 10a to the second surface 10b. An electromagnetic shielding layer can be selectively disposed in the substrate 10 to shield electromagnetic waves transferring from the side of the first surface 10a to the side of the second surface 10b of the substrate 10. The dielectric layer 20 is a multilayer structure, and the dielectric layer 20 comprises an impedance matching structure 21 and an interconnection structure 22. The impedance matching structure 21 is electrically connected to the substrate 10 through the interconnection structure 22. The molding layer 50 comprises a plurality of conductor structures and a plurality of chips 40. The chips 40 comprises a control chip 401, analog to digital converters, digital to analog converters, power amplifiers, RF frond-end devices, or storage devices. The control chip 401 is disposed on a first direction L1 from the impedance matching structure 21. The first direction L1 is vertical to the first surface 10a of the substrate 10. The control chip 401 is electrically connected to the impedance matching structure 21 to tune the impedance matching structure 21. The antenna layer 60 is composed of dielectric material 61 and conductor material 62, and the conductor material 62 form antenna structures. The antenna layer 60 comprises at least one antenna electrically connected to the substrate 10. The antenna layer 60 could comprises a plurality of antenna array disposed as an end-fire array or a broadside array.

Compare with the antenna package structure 1' of the embodiment and the antenna package structure 1 of the previous embodiment, the thickness of the antenna package structure 1' of the embodiment is reduced due to the thinning process is taken to the conductor structures 30, the chips 40, and the molding layer 50. Besides the thickness of the antenna package structure 1' is reduced, the chips 40 is exposed from the molding layer 50. As a result, the antenna package structure 1' is easier to be disposed on external devices and the heat dissipation ability of the antenna package structure 1' is improved.

Figure 11:
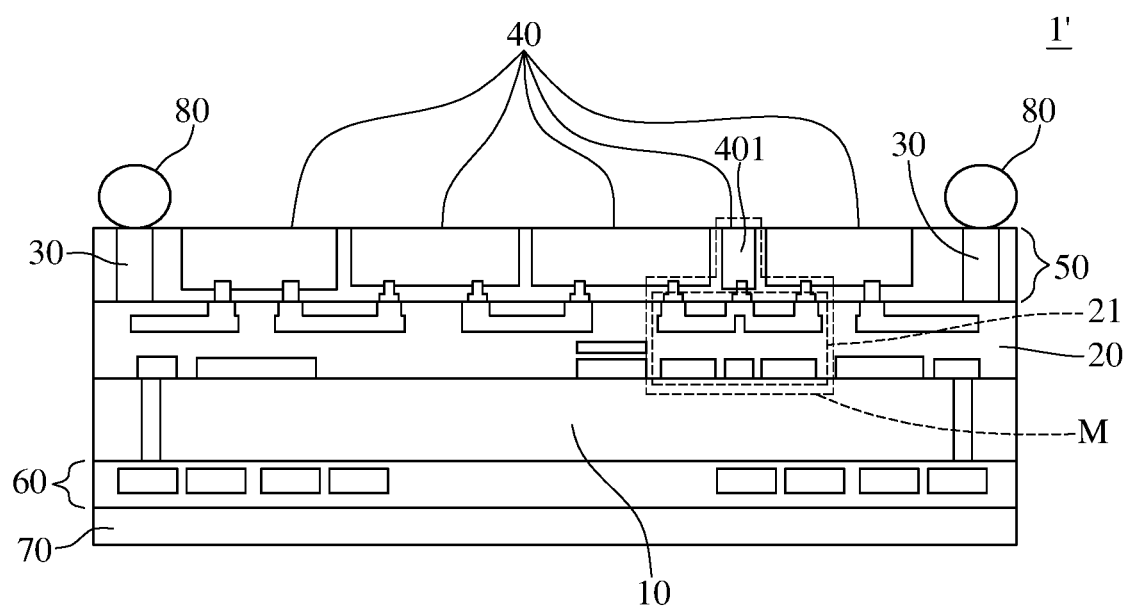

As illustrated in FIG. 11, the antenna package structure 1' of the embodiment can also selectively to form a plurality of metal balls 80 on the conductor structures 30 for the electrical connection of the antenna package structure 1 to external devices. The material of metal balls 80 comprises gold, tin, silver, or copper. The forming method of the metal balls 80 comprises thin film process, printing process, electroless plating, plating, or deposition process.

According to the antenna package structure of the embodiments of the disclosure, the antenna, active components, and passive components could be formed in a single package structure by 3D integrated circuit heterogeneous integration technology. Also, the impedance matching of the antenna package structure can be done promptly with the tunable matching structure located in the package. As the result, issues of impedance mismatch can be dealt with the configuration of the tunable matching structure. In addition, issues of stress mismatch or warpage problem during the manufacturing process can also be solved by tunable matching structure.

While the application has been described by way of example and in terms of exemplary embodiment, it is to be understood that the application is not limited thereto. Those who are skilled in this technology can still make various alterations and modifications without departing from the scope and spirit of this application. For example, the systems and methods described in the embodiments of the present application may be implemented in physical embodiments of hardware, software, or a combination of hardware and software. Therefore, the scope of the present application shall be defined and protected by the following claims and their equivalents.

What is claimed is:

1. An antenna package structure, comprising:
   a substrate with a first surface and a second surface;
   a dielectric layer disposed on the first surface of the substrate, wherein the dielectric layer comprises at least one impedance matching structure and an interconnection structure, wherein the impedance matching structure electrically is connected to the substrate by the interconnection structure;
   a molding layer disposed on the dielectric layer, wherein the molding layer comprises a plurality of chips and a plurality of conductor structures, wherein the chips comprise a control chip, and each of the conductor structures penetrate through the molding layer and electrically connected to the interconnection structure of the dielectric layer, wherein the control chip is electrically connected to the impedance matching structure a control the impedance matching structure, and the control chip is disposed on a first direction of the impedance matching structure, wherein the first direction is vertical to the first surface;
   an antenna layer disposed on the second surface of the substrate, wherein the antenna layer comprises at least one antenna electrically connected to the substrate; and
   a protection layer covering the antenna layer.

2. The antenna package structure as claimed in claim 1, wherein the impedance matching structure is a slow wave structure.

3. The antenna package structure as claimed in claim 2, wherein the impedance matching structure comprises:
   a first conductor plate disposed on a layer of the dielectric layer, wherein the first conductor plate extends along a second direction;
   a second conductor plate disposed on the layer of the dielectric layer, wherein the second conductor plate is disposed along a third direction neighboring to the first conductor plate, wherein the first conductor plate and the second conductor plate are electrically connected to a ground; and
   at least one floating conductor line disposed on another layer of the dielectric layer, wherein the at least one floating conductor line extends along the third direction, and each of the at least one floating conductor line comprises a first conductor line, a second conductor line, and a switch device, wherein the first conductor line is disposed below the first conductor plate, wherein the switch device is disposed between the first conductor line and the second conductor line as to electrically conducted to the first conductor line or the second conductor line selectively.

4. The antenna package structure as claimed in claim 1, wherein the at least one antenna is an antenna array, and the antenna array is disposed as an end-fire array or a broadside array.

5. The antenna package structure as claimed in claim 1, wherein the substrate further comprises an electromagnetic shielding layer to shield electromagnetic waves transfer from the antenna to a side of the first surface of the substrate.

6. The antenna package structure as claimed in claim 1, wherein the chips in the molding layer comprises analog to digital converters, digital to analog converters, power amplifiers, RF front-end devices, or storage devices.

7. The antenna package structure as claimed in claim 1, wherein the dielectric layer further comprises a plurality of passive components, and the passive components are electrically connected to the antenna layer or the substrate through the interconnection structure.

8. The antenna package structure as claimed in claim 7, wherein the passive components are not exist in a direction vertical to the first surface of the substrate.

9. The antenna package structure as claimed in claim 1, wherein a material of the protection layer comprises dielectric material or liquid crystal, and the dielectric material comprises polycrystalline silicon and glass.

10. The antenna package structure as claimed in claim 1, wherein a material of the substrate comprises low temperature co-fired ceramic (LTCC), FR-4 epoxy glass fabric, RO high frequency circuit board, glass, or thermal interface materials.

11. A manufacturing method of an antenna package structure comprising:
providing a substrate, wherein the substrate having a first surface and a second surface;
disposing a dielectric layer on the first surface of the substrate, wherein the dielectric layer comprises at least one impedance matching structure and an interconnection structure, wherein the impedance matching structure is electrically connected to the substrate through the interconnection structure;
disposing a plurality of chips and a plurality of conductor structures on the dielectric layer, wherein the conductor structures are electrically connected to the interconnection structure of the dielectric layer, wherein the chips comprise a control chip;
covering a molding layer on the chips, the dielectric layer, and the conductor structures, and exposing each of the conductor structures from the molding layer;
rotating the substrate;
disposing an antenna layer on the second surface of the substrate, wherein the antenna layer comprises at least one antenna electrically connected to the substrate; and
covering a protection layer on the antenna layer;
wherein the control chip is electrically connected to the impedance matching structure to control the impedance matching structure, wherein the control chip is disposed on a first direction of the impedance matching structure, wherein the first direction is vertical to the second surface.

12. The manufacturing method of the antenna package structure as claimed in claim 11, wherein a forming method of the impedance matching structure in the dielectric layer comprises:
forming a first conductor plate in a layer of the dielectric layer, wherein the first conductor plate is extending along a second direction;
forming a second conductor plate in the layer of the dielectric layer, wherein the second conductor plate is disposed neighboring to the first conductor plate and along a third direction from the first conductor plate; and
forming at least one floating conductor line in another layer of the dielectric layer, wherein the floating conductor line is extending along the third direction, wherein the at least one floating conductor comprises a first conductor line, a second conductor line, and a switch device, wherein the first conductor line is disposed below the first conductor plate, wherein the second conductor line is disposed below the second conductor plate, wherein the switch device is disposed between the first conductor line and the second conductor line as to conduct the first conductor line or the second conductor line selectively;
wherein the first conductor plate and the second conductor plate are electrically connected to ground.

13. The manufacturing method of the antenna package structure as claimed in claim 11, wherein the at least one antenna disposed as an end-fire array or a broadside array.

14. The manufacturing method of the antenna package structure as claimed in claim 11, further comprising forming an electromagnetic shielding layer in the substrate, wherein the electromagnetic shielding layer shields electromagnetic waves transfer from the antenna layer to a side of the first surface of the substrate.

15. The manufacturing method of the antenna package structure as claimed in claim 11, wherein disposing the chips and the conductor structures on the dielectric layers, the chips comprise analog to digital converters, digital to analog converters, power amplifiers, RF front-end devices, or storage devices.

16. The manufacturing method of the antenna package structure as claimed in claim 11, further comprises disposing a plurality of passive components in the dielectric layer, wherein the passive components are electrically connected to the antenna layer or the substrate through the interconnection structure.

17. The manufacturing method of the antenna package structure as claimed in claim 16, wherein the passive components do not exist in a direction vertical to the first surface from the impedance matching structure.

18. The manufacturing method of the antenna package structure as claimed in claim 11, wherein a material of the protection layer comprises dielectric material or liquid crystal, wherein the dielectric material comprises polycrystalline silicon and glass.

19. The manufacturing method of the antenna package structure as claimed in claim 11, wherein a material of the substrate comprises low temperature co-fired ceramic (LTCC), FR-4 epoxy glass fabric, RO high frequency circuit board, glass, or thermal interface materials.

20. The manufacturing method of the antenna package structure as claimed in claim 11, wherein exposing each of the conductor structures from the molding layer comprises performing a thinning process.

* * * * *